(12) United States Patent
Johansson et al.

(10) Patent No.: US 8,307,248 B2
(45) Date of Patent: Nov. 6, 2012

(54) METHOD AND A SYSTEM FOR ESTIMATING ERRORS INTRODUCED IN A TIME-INTERLEAVED ANALOG-TO-DIGITAL CONVERTER SYSTEM

(75) Inventors: Håkan Johansson, Linköping (SE); Per Löwenborg, Linköping (SE)

(73) Assignee: Signal Processing Devices Sweden AB, Linköping (SE)

( * ) Notice: Subject to any disclaimer, the term of this patent is extended or adjusted under 35 U.S.C. 154(b) by 625 days.

(21) Appl. No.: 12/306,942

(22) PCT Filed: Jun. 30, 2006

(86) PCT No.: PCT/SE2006/000809
§ 371 (c)(1),
(2), (4) Date: Oct. 28, 2009

(87) PCT Pub. No.: WO2008/002214
PCT Pub. Date: Jan. 3, 2008

(65) Prior Publication Data
US 2010/0049483 A1 Feb. 25, 2010

(51) Int. Cl.
*G06F 11/00* (2006.01)
(52) U.S. Cl. ........................................ 714/704
(58) Field of Classification Search ................... 714/704
See application file for complete search history.

(56) References Cited

U.S. PATENT DOCUMENTS

| | | | | |
|---|---|---|---|---|
| 5,991,622 A * | 11/1999 | Henry, Jr. | | 455/434 |
| 6,229,560 B1 * | 5/2001 | Jun | | 348/21 |
| 6,414,470 B1 * | 7/2002 | Liu et al. | | 323/272 |
| 6,509,800 B2 * | 1/2003 | Stockton | | 331/11 |
| 6,570,863 B1 * | 5/2003 | Kim et al. | | 370/342 |
| 6,674,325 B2 * | 1/2004 | Chen et al. | | 330/124 D |
| 6,757,863 B2 * | 6/2004 | Kaneshige et al. | | 714/775 |
| 7,028,232 B2 * | 4/2006 | Kyosti et al. | | 714/704 |
| 7,039,094 B2 * | 5/2006 | Kim et al. | | 375/147 |
| 7,342,975 B2 * | 3/2008 | Schenk | | 375/260 |
| 7,555,080 B2 * | 6/2009 | Kim | | 375/350 |

FOREIGN PATENT DOCUMENTS

| | | |
|---|---|---|
| EP | 1 401 105 A1 | 3/2004 |
| WO | WO-01/99282 A1 | 12/2001 |
| WO | WO 2004/079917 A1 | 9/2004 |

OTHER PUBLICATIONS

Elborsson et al., Blind Adaptive Equalization of Mismatch Errors in a Time-Interleaved A/D Converter System, IEEE Transactions on Circuits and Systems, -I: Regular Papers, vol. 51, No. 1, Jan. 2004. Fu et al., A Digital Background Calibration Technique for Time-Interleaved Analog-to-Digital Converters, IEEE Journal of Solid-State Circuits, vol. 33, No. 12, Dec. 1998.
PCT/ISA/210—International Search Report—Jan. 29, 2007.
PCT/ISA/237—Written Opinion of the International Searching Authority—Jan. 29, 2007.
Communication Pursuant to Article 94(3) EPC from the European Patent Office, dated Oct. 19, 2011, issued in connection with counterpart Application No. EP 06 747 981.6-2206.

* cited by examiner

*Primary Examiner* — James C Kerveros
(74) *Attorney, Agent, or Firm* — Venable LLP; Eric J. Franklin (57) ABSTRACT

A method and a module for estimating a plurality of relative channel-error for at least one signal with respect to a reference signal. The signals and are produced by an analog-to-digital module including parallel and time interleaved analog-to-digital converters and are received by an estimation module. The method is performed by the estimation module and includes defining a function representing a relationship between the reference signal and an arbitrary signal in the group of signals, selecting a first reference signal in the group of signals, selecting a second signal from the remaining signals in the group, optimizing the function so as to obtain an estimate of the plurality of relative channel-error, and repeating the selecting a second signal and optimizing the function for each remaining signal.

21 Claims, 6 Drawing Sheets

METHOD AND A SYSTEM FOR ESTIMATING ERRORS INTRODUCED IN A TIME-INTERLEAVED ANALOG-TO-DIGITAL CONVERTER SYSTEM

CROSS-REFERENCE TO RELATED APPLICATIONS

This application is the national phase under 35 U.S.C. §371 of PCT/SE2006/000809 filed 30 Jun. 2006.

TECHNICAL FIELD

The invention relates to a method and system for estimating errors introduced in a time-interleaved analog-to-digital converter system.

BACKGROUND OF THE INVENTION

Due to its robustness and precision digital signal processing (DSP) has replaced analog signal processing (ASP) in most technical fields of today, which has enabled the development of information systems such as mobile communication systems and sophisticated medical aids etc. However, the real world is analog by nature, and there is therefore an increasing need for high performance analog-digital interfaces (ADI's), typically realized by a conventional analog-to-digital converter (ADC). Such ADCs are required in almost all signal processing and communication systems and they are often one of the most critical components, i.e., they tend to determine the overall system performance.

Analog-to-digital conversion can be viewed as a uniform sampling followed by a quantization (truncating or rounding the value). The resolution of an ADC is the number of bits used in the quantization and the data rate of an ADC is the number of samples produced per second on average. Hence, a sampling period of e.g. T gives a data rate or sampling rate of 1/T.

Figure 1A:
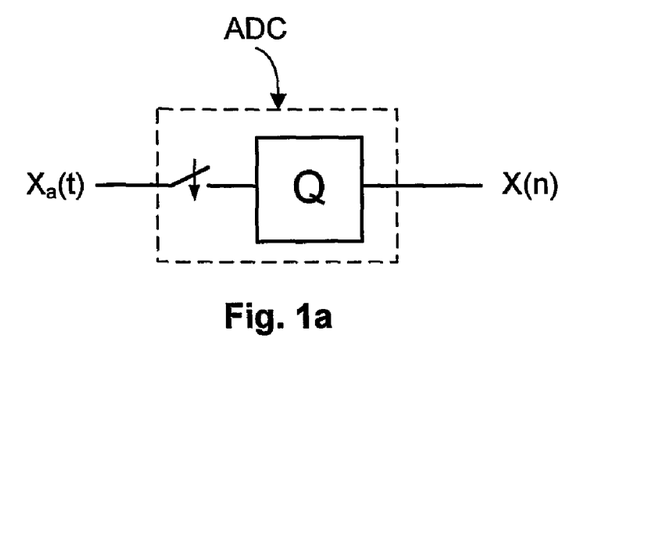
FIG. 1a shows a schematic illustration of a single exemplifying ADC.
Figure 1B:
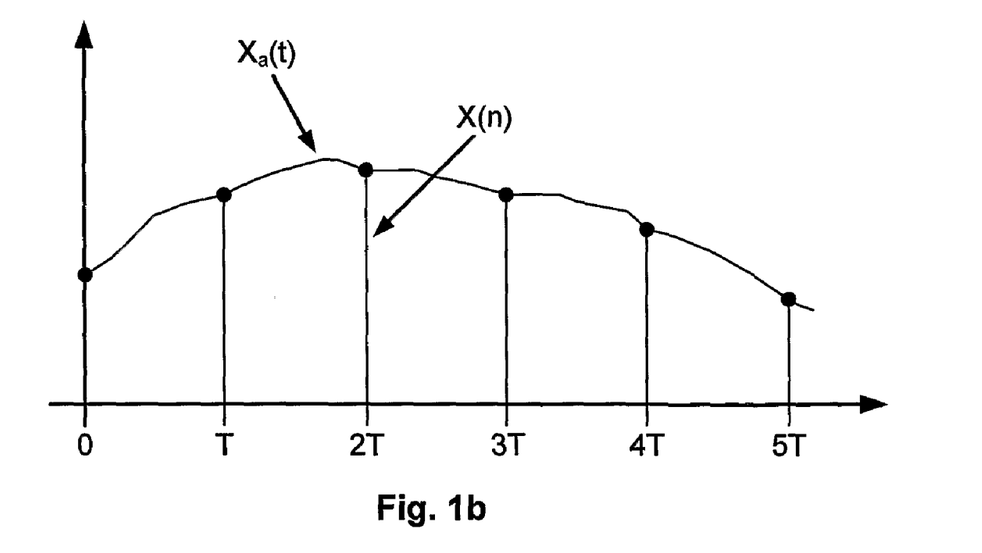
FIG. 1b shows a schematic illustration of an exemplifying analog-to-digital conversion by the ADC in FIG. 1a, whereby a sequence X(n) is obtained from an analog signal $X_a(t)$ by sampling the latter equidistantly at t=nT followed by quantization.

FIGS. 1a and 1b illustrate an exemplifying analog-to-digital conversion wherein a sequence $X(n)$ is obtained from an analog signal $X_a(t)$ by sampling the latter equidistantly at $t=nT$, i.e., $X(n)=X_a(nT)$, followed by quantization.

There are several existing analog-to-digital conversion techniques, which can be grouped into categories such as flash, pipelined, successive-approximation, integrating, and oversampling sigma-delta converters. The ADC performance is mainly described in terms of sampling rate, resolution, and power consumption.

Previously, ADCs have been good enough for their purposes, but their limitations are now becoming problematic since their capacity does no longer match the rapid development of digital technology. The situation is getting worse as semiconductor process feature sizes are decreasing and data rate requirements of information processing systems increase, since for ADCs, the achievable resolution is highly dependent on the conversion rate. Initially, the progress in analog-to-digital converter development was due to new and better analog circuit topologies and technologies. However, during the past decade, it has become evident that additional major performance improvements most likely cannot be achieved by further progress in topologies and technologies alone. For example, during the last decade, only some 1.5-2 bits of resolution improvement has been achieved for a given speed performance.

In all ADC architectures and technologies known today it is very difficult to simultaneously achieve high resolution and high sampling rate. Such speed/resolution trade-offs are very common in analog circuit design. Resolution is to a large extent determined by matching accuracy of physical devices. For example, in Metal-Oxide Semiconductor (MOS) technology, the variance of the matching error of two devices is a function of the inverse of the device area. Hence, when increasing the area the matching will be improved and the accuracy is increased. However, increasing the area also increases parasitic capacitances of the devices which in general decreases the operational bandwidth of the circuit and thereby reduces the speed.

Figure 2A:
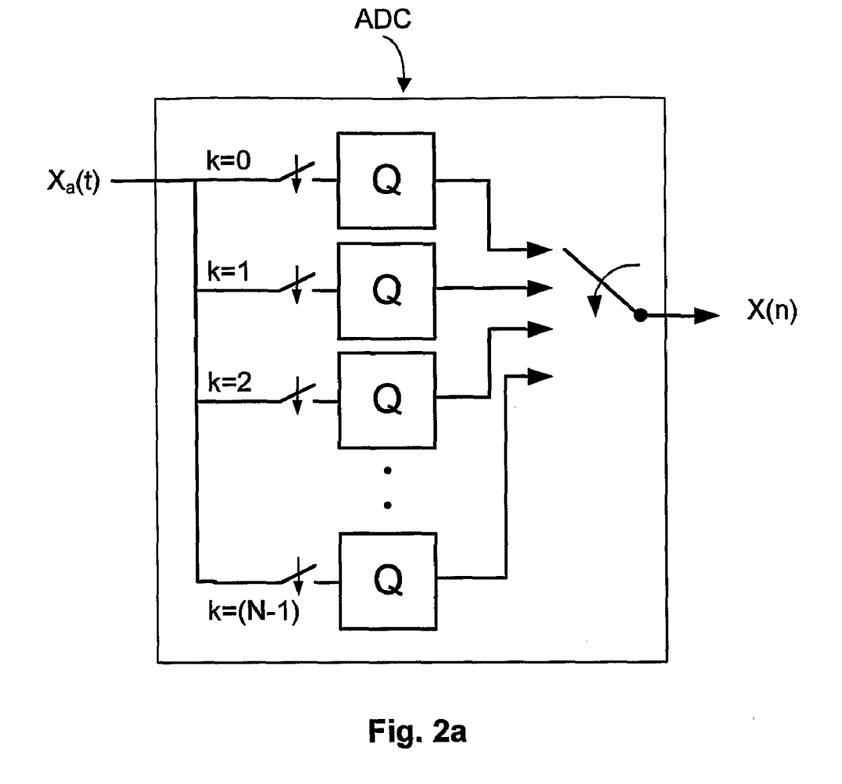
FIG. 2a shows a schematic illustration of several ADCs as the one in FIG. 1a operated in parallel so as to accomplish a time-interleaved sampling.
Figure 2B:
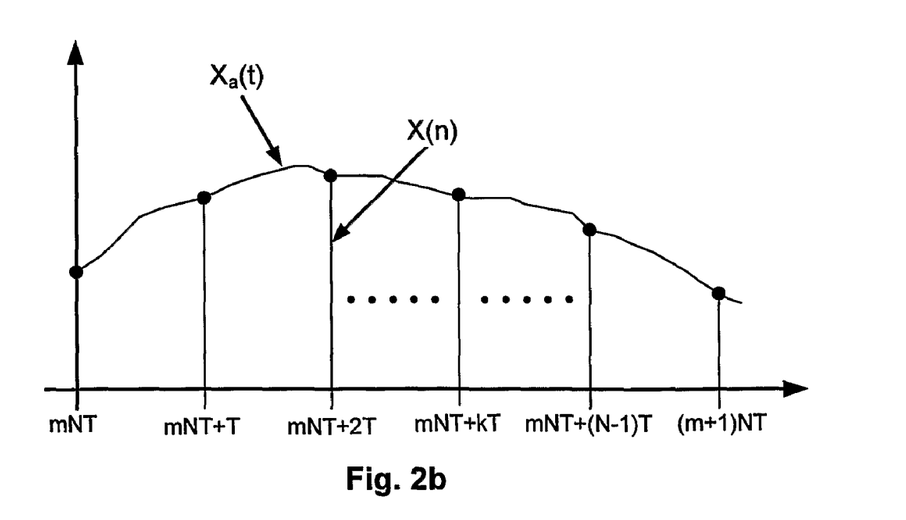
FIG. 2b shows a schematic illustration of an exemplifying analog-to-digital conversion by the ADC in FIG. 1a, whereby a sequence X(n) is obtained from an analog signal $X_a(t)$ by sampling instants distributed uniformly in time according to $t_k$=(mNT+kT) followed by quantization.

One technique, used since the early eighties, aimed to overcome the speed limitation of high-resolution analog-to-digital conversion is the operation of several ADCs in parallel. The overall ADC system may consists of, say, N ADCs. This channelization into N branches enables a reduction of the sampling frequency of each individual converter. Hence, if an effective sampling rate $f_s$ is required, each ADC can work at the reduced sampling frequency $f_s/N$. The sampling instants are distributed uniformly in time according to $t_k=(k+mN)T$, $k=0, 1, \ldots N-1$, and $T=1/f_s$ i.e., the converters are time-interleaved. The principle of ideal N time-interleaved ADCs is shown in FIGS. 2a and 2b.

Using a group of identical ADCs (the ideal case), which is the most commonly selected scheme, the resolution of the overall time-interleaved ADC system is equal to that of each individual converter. In view of the speed/resolution trade-off, the reduction in sampling rate of each converter used in a time-interleaved ADC enables the realization of a higher resolution than what would be possible if a single ADC was to be used.

Similarly, if each ADC is being operated at the limit of its speed, the overall ADC sampling rate can be increased beyond what is achievable using a single unit.

However, there are significant problems associated with time-interleaved ADCs. Besides performance degrading effects common to all ADCs, such as for example random variations to the location of the sampling instants (sampling jitter), sample-and-hold circuit nonlinearity, comparator metastability, and nonuniform quantization (static nonlinearity), new errors limit the achievable resolution. The former degradations are consequences of fundamental and inevitable error sources such as fabrication process imperfections, non-symmetric circuit layout, circuit parasitics, and noise. The new errors arise from the parallelization itself and are all introduced by differences between the individual ADCs used in the time-interleaved ADC system. These errors are referred to as channel mismatch errors, and give rise to nonlinear distortion that degrades the resolution.

As seen in FIG. 2, the subconverters in a time-interleaved ADC system are operated periodically and each ADC is responsible for the task of digitizing every Nth sample. Comparing with the desired behavior of a single ADC, as illustrated in FIGS. 1a and 1b, one can see that in order to work properly, a time-interleaved ADC system requires that all sub-converters behave identically. If not, the system will not be equivalent to one single ADC working at N times higher sampling frequency.

One channel mismatch error originates from discrepancies in the time instants when each sub-converter is actually taking samples from the analog waveform, i.e. the aperture delay mismatch. Aperture delay of an ADC is the time difference between when a sample is supposed to be taken and when the sample is actually taken. In an ADC, the aperture delay varies slightly from sample to sample and this variation is called aperture jitter. The aperture jitter of an ADC is, however, in general much shorter than the average aperture delay. Aperture jitter is present in all types of ADCs and is hence not an error specific to time-interleaved ADCs. We will, therefore, not consider the aperture jitter further, but instead focus on the average aperture delay and the damage the average aperture delay of the sub-converters causes to a system of time-interleaved ADCs.

Other harmful channel mismatch errors are first-order gain mismatch and offset mismatch. Like the aperture delay mismatches the distortion caused by these errors must also be eliminated or at least reduced to a satisfactory level.

In order to remove these mismatch errors, the errors between the different ADC:s must first be determined. These errors can then be used to o remove the errors from the digitized signal.

One approach to determine the timing errors in particular is to apply a known calibration signal, and compare the resulting digitized signal with the expected result. An example of this approach is given in the journal paper "A digital-background calibration technique for minimizing timing-error effects in time-interleaved ADC's" by H. Jin and E. K. F. Lee. However, such an approach requires careful timing of input and output, in order to enable a correct comparison, and this makes the method very difficult to implement with high precision.

Instead, it has been proposed to estimate the timing errors from an unknown, but bandlimited signal. One example of such estimation in a parallel ADC is given in WO 04/079917. In the system described in WO 04/079917, the digitized signal can be used to estimate the timing errors, as long as it is band limited to the system bandwidth. However, this requires feedback of the reconstructed signal to the estimator, so that each iteration of the timing error estimation is based on the current reconstruction.

Considering the drawbacks affecting the prior art time-interleaved ADCs it is an object of the present invention to provide estimation of mismatch errors with such precision that no feedback of the reconstructed signal is required. It is a further object to enable reconstruction of a digitized signal by means of an unknown bandlimited signal.

SUMMARY OF THE INVENTION

The present invention obviates or mitigates at least one of the above drawbacks by providing a method for estimating a plurality of relative channel-error for at least one signal $X_k$ with respect to a reference signal $X_0$, which signals $X_0$ and $X_k$ belong to a group of digitized signals $X_0$-$X_{N-1}$ received by an estimation module from an analog-to-digital module comprising a plurality of parallel and time interleaved analog-to-digital converters.

The method is performed by said estimation module and comprises the initial steps of:
  defining S1 a function $F(d_k,G_k,C_k)$ representing a relationship between said reference signal $X_0$ and an arbitrary signal $X_k$ in said group of signals $X_0$-$X_{N-1}$;
  selecting S2 a first reference signal $X_0$ in said group of signals $X_0$-$X_{N-1}$; and the further steps of:
  selecting S3 a second signal $X_k$ from the remaining signals $X_1$-$X_{N-1}$ in said group; and
  optimizing S4 the function $F(d_k,G_k,C_k)$ so as to obtain an estimate $\hat{d}_k$, $\hat{G}_k$, $\hat{C}_k$ or a representation thereof of said plurality of relative channel-error $d_k$, $G_k$, $C_k$;
  repeating said further steps for each remaining signal $X_1$-$X_{N-1}$.

As the skilled reader realizes, this includes calculating two channel-errors, calculating three channel-errors and possibly calculating even more channel-errors. The estimated channel-errors are preferably a delay mismatch $d_k$, a gain mismatch $G_k$ and an offset mismatch $C_k$ or at least two of these. It is likewise obvious to those skilled in the art that any of the signals $X_0$-$X_{N-1}$ can be selected as a reference signal. In addition, the steps in the method described above must not necessarily be performed in the given order.

It is preferred that the step of optimizing S4 is preformed by an iterative process comprising the steps of:
  feedback of the channel-error or channel-errors estimated in the previous iteration so as to adjust the channel-error in the sequence of the second signal $X_k$; and
  updating the function $F(d_k,G_k,C_k)$ with a sequence of the second signal $X_k$ having channel-errors adjusted by said feedback;
  repeating said feedback and said update until a satisfactory estimation is obtained.

Typically, a sequence corresponds to a batch of samples from a digitized signal $X_0$-$X_{N-1}$ received by the estimation module from the analog-to-digital module.

However, in some embodiments a sequence be as little as a single sample of the N digitized signals $X_0$-$X_{N-1}$.

It is also preferred that the method calculates said plurality of estimated channel-errors $\hat{d}_k$, $\hat{G}_k$, $\hat{C}_k$ by defining S1 said function $F(d_k,G_k,C_k)$ as a measure of the difference between said sequences with respect to said plurality of channel-errors $d_k$, $G_k$, $C_k$, and performing an optimization by minimizing S4 the defined function $F(d_k,G_k,C_k)$.

In another embodiment of the method at least one of the estimated plurality of channel-errors $\hat{d}_k$, $\hat{G}_k$, $\hat{C}_k$ is an estimated delay $\hat{d}_k$ corresponding to an delay mismatch $d_k$, which estimated delay $\hat{d}_k$ is applied to the selected signal $X_k$ using a fractional delay filter.

In still another embodiment of the method said fractional delay filter is implemented using a Lagrange, Farrow Structure or Thiran Allpass.

In a preferred embodiment of the method, the function is defined as:

$$F(d_k, G_k, C_k) = \sum_{n=n_0}^{n_0+N-1} (y_k(n, d_k, G_k, C_k) - x_0(n))^2$$

In addition, the present invention obviates or mitigates at least one of the above drawbacks by providing an estimation module for estimating a plurality of relative channel-errors for at least one signal $X_k$ with respect to a reference signal $X_0$. The signals $X_0$ and $X_k$ belong to a group of digitized signals $X_0$-$X_{N-1}$ produced by an analog-to-digital module comprising a plurality of parallel and time interleaved analog-to-digital converters. The estimation module is arranged to operatively receive said digitized signals $X_0$-$X_{N-1}$ and to operatively select a first reference signal $X_0$ in said group of signals $X_0$-$X_{N-1}$.

The estimation module is characterized by being further arranged to operatively:
  select a second signal $X_k$ from the remaining signals $X_1$-$X_{N-1}$ in said group of signals;
  optimize a function $F(d_k,G_k,C_k)$, representing a relationship between the first signal $X_0$ and the second signal $X_k$ so as to obtain an estimate $\hat{d}_k$, $\hat{G}_k$, $\hat{C}_k$ or a representation thereof of said plurality of relative channel-errors $d_k$, $G_k$, $C_k$;
  repeat said selection and optimizing for each remaining signal $X_1$-$X_{N-1}$ in said group of signals.

As the skilled reader realizes, this includes calculating two channel-errors, calculating three channel-errors and possibly calculating even more channel-errors. The estimated channel-errors are preferably a delay mismatch $d_k$, a gain mismatch $G_k$ and an offset mismatch $C_k$ or at least two of these. It is likewise obvious to those skilled in the art that any of the signals $X_0$-$X_{N-1}$ can be selected as a reference signal. In addition, the measures taken by the estimation module described above must not necessarily be performed in the given order.

It is preferred that the estimation module is performing said optimizing by being further arranged to operatively:
  feedback the channel-error or channel-errors estimated in the previous iteration so as to adjust the channel-error in the sequence of the second signal $X_k$; and
  update the function $F(d_k, G_k, C_k)$ with a sequence of the second signal $X_k$ having channel-errors adjusted by said feedback;
  repeat said feedback and said update until a satisfactory estimation is obtained.

Typically, a sequence corresponds to a batch of samples from a digitized signal $X_0$-$X_{N-1}$ received by the estimation module from the analog-to-digital module. However, in some embodiments a sequence be as little as a single sample of the N digitized signals $X_0$-$X_{N-1}$.

It is also preferred that the estimation module is characterized by being arranged to operatively calculate said plurality of estimated channel-error $\hat{d}_k, \hat{G}_k, \hat{C}_k$ by utilizing a function $F(d_k, G_k, C_k)$ defining a measure of the difference between said sequences with respect to said plurality of channel-errors $d_k$, $G_k$, $C_k$, and by performing an optimization by minimizing the defined function $F(d_k, G_k, C_k)$.

In another embodiment the estimation module is characterized by being arranged to operatively estimate a plurality of channel-errors, wherein at least one of the estimated channel-errors $\hat{d}_k, \hat{G}_k, \hat{C}_k$ is an estimated delay $\hat{d}_k$ corresponding to a delay mismatch $d_k$, and to apply the estimated delay $\hat{d}_k$ to the selected signal $X_k$ using a fractional delay filter.

In still another embodiment the estimation module is characterized in that said fractional delay filter is implemented by using a Lagrange, Farrow Structure or Thiran Allpass.

In a preferred embodiment the estimation module is characterized by being adapted to use the function:

$$F(d_k, G_k, C_k) = \sum_{n=n_0}^{n_0+N-1} (y_k(n, d_k, G_k, C_k) - x_0(n))^2$$

Furthermore, the present invention obviates or mitigates at least one of the above drawbacks by providing a system for reducing or eliminating a plurality of relative channel-errors for at least one signal $X_k$ with respect to a reference signal $X_0$. The signals $X_0$ and $X_k$ belong to a group of digitized signals $X_0$-$X_{N-1}$ produced by an analog-to-digital module comprising a plurality of parallel and time interleaved analog-to-digital converters. The system comprises an estimation module according to any of the embodiments of an estimation module described above. The estimation module is arranged to operatively receive said digitized signals $X_0$-$X_{N-1}$ and to estimate a plurality of relative channel-errors $d_k$, $G_k$, $C_k$. In addition the system comprises a reconstruction module that is characterized by: being arranged to operatively apply said least one relative channel-error $d_k$, $G_k$, $C_k$, or a representation thereof to said selected signal $X_k$ belonging to a group of digitized signals ($X_0$-$X_{N-1}$) produced by the time interleaved analog-to-digital module, so as to reduce or eliminate the relative channel-errors $d_k$, $G_k$, $C_k$.

Further advantages of the present invention and embodiments thereof will appear from the following detailed description of the invention.

DETAILED DESCRIPTION OF PREFERRED EMBODIMENTS

A First Embodiment

Figure 3:
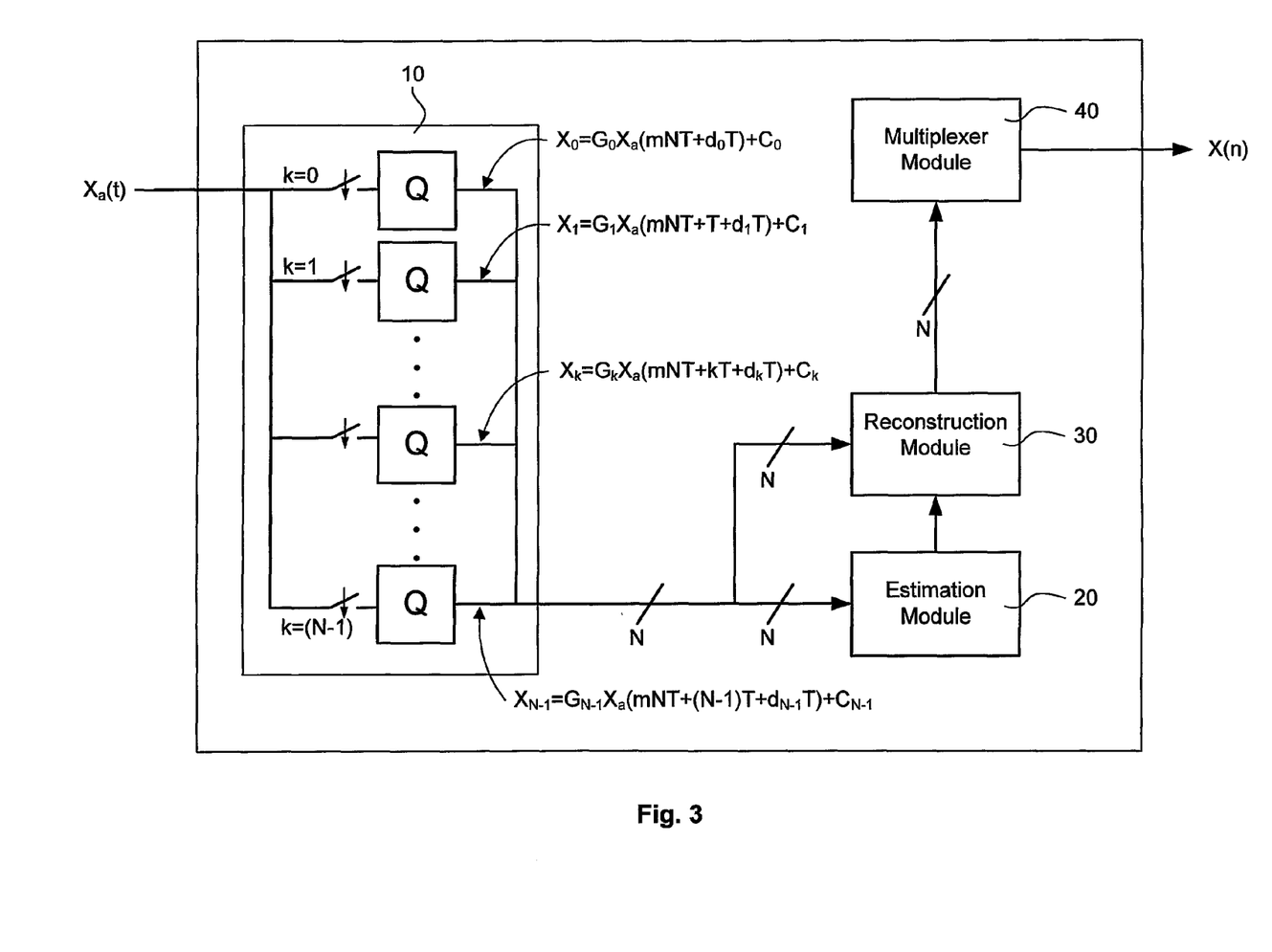
FIG. 3 shows a time-interleaved analog-to-digital converter system.

A first exemplifying embodiment of the present invention is illustrated as a general block diagram in FIG. 3, showing a time-interleaved analog-to-digital converter system, which receives an analog input signal $X_a(t)$ and produces a time-interleaved digitized output representation X(n) of said signal.

The exemplifying time-interleaved analog-to-digital converter system in FIG. 3 comprises a time interleaved analog-to-digital module 10 having N parallel and time interleaved analog-to-digital converters arranged to produce N digitized signals:

$X_0 = G_0 X_a(mNT + d_0 T) + C_0$ to $X_{N-1} = G_{N-1} X_a(mNT + (N-1)T + d_{N-1}) + C_{N-1}$.

As indicated in the background of the invention, the N digitized signals $X_0$ to $X_{N-1}$ produced by a non-ideal time-interleaved analog-to-digital converter are typically comprising relative channel mismatch errors. In particular, a signal $X_k$ of the N digitized signals $X_0$ to $X_{N-1}$ produced by the analog-to-digital converter 10 in FIG. 3 may comprise:
  aperture-delay mismatches $d_k$;
  gain mismatches $G_k$; and
  offset mismatches $C_k$.

To remedy these channel-errors $d_k, G_k, C_k$ the analog-to-digital converter system in FIG. 3 has been provided with an error-estimation module 20 arranged to receive said N digitized signals and to estimate a relative channel-error vector based on these N signals. The system is also provided with a digital reconstruction-filter module 30. The reconstruction-filter module 30 is arranged to receive the N digitized signals and the estimated relative channel-error vector or at least information corresponding thereto. The reconstruction module 30 is further arranged to eliminate or at least reduce the channel-errors based on the estimated relative channel-error vector, so as to generate reconstructed output signals. In addition, to create a reconstructed time-interleaved digitized output signal X(n) the system in FIG. 3 is provided with a multiplexer module 40 arranged to receive and multiplex the N reconstructed output signals from said reconstruction module 30.

The system in FIG. 3 operates in two steps, the estimation phase and the reconstruction phase. In the estimation phase, the relative channel-errors between the different ADC:s are determined. The determined channel-errors are then preferably used to define filter coefficients of the digital reconstruction module 30. This is preferably done in the reconstruction module 30. However, it may alternatively be done in the estimation module 20. Further, in step 2 the digital reconstruction-filter module 30 reconstructs the N digitized signals received from the analog-to-digital module 10, based on said filter coefficients defined in step 1, so as to eliminate or at least reduce the channel-errors. The reconstructed signals are then multiplexed in the multiplexer module 40, which outputs a reconstructed time-interleaved digitized output signal X(n). In the reconstruction phase, the estimation module 20 may be turned off, whereby the system can operate at a lower power.

As is obvious to the man skilled in the art, the analog-to-digital converter system in FIG. 3 may further comprise a controllable input filter module that can be arranged to filter the analog input signal $X_a(t)$ to a bandwidth suitable for both the estimation phase and the reconstruction phase. In the estimation phase the input signal $X_a(t)$ needs to be bandlimited to the Nyquist frequency of a single ADC, and in the reconstruction phase the input signal $X_a(t)$ needs to be bandlimited to the Nyquist frequency of the full system, this to avoid aliasing.

It should be noted that the estimation step and the reconstruction step may be active simultaneously.

Figure 4:
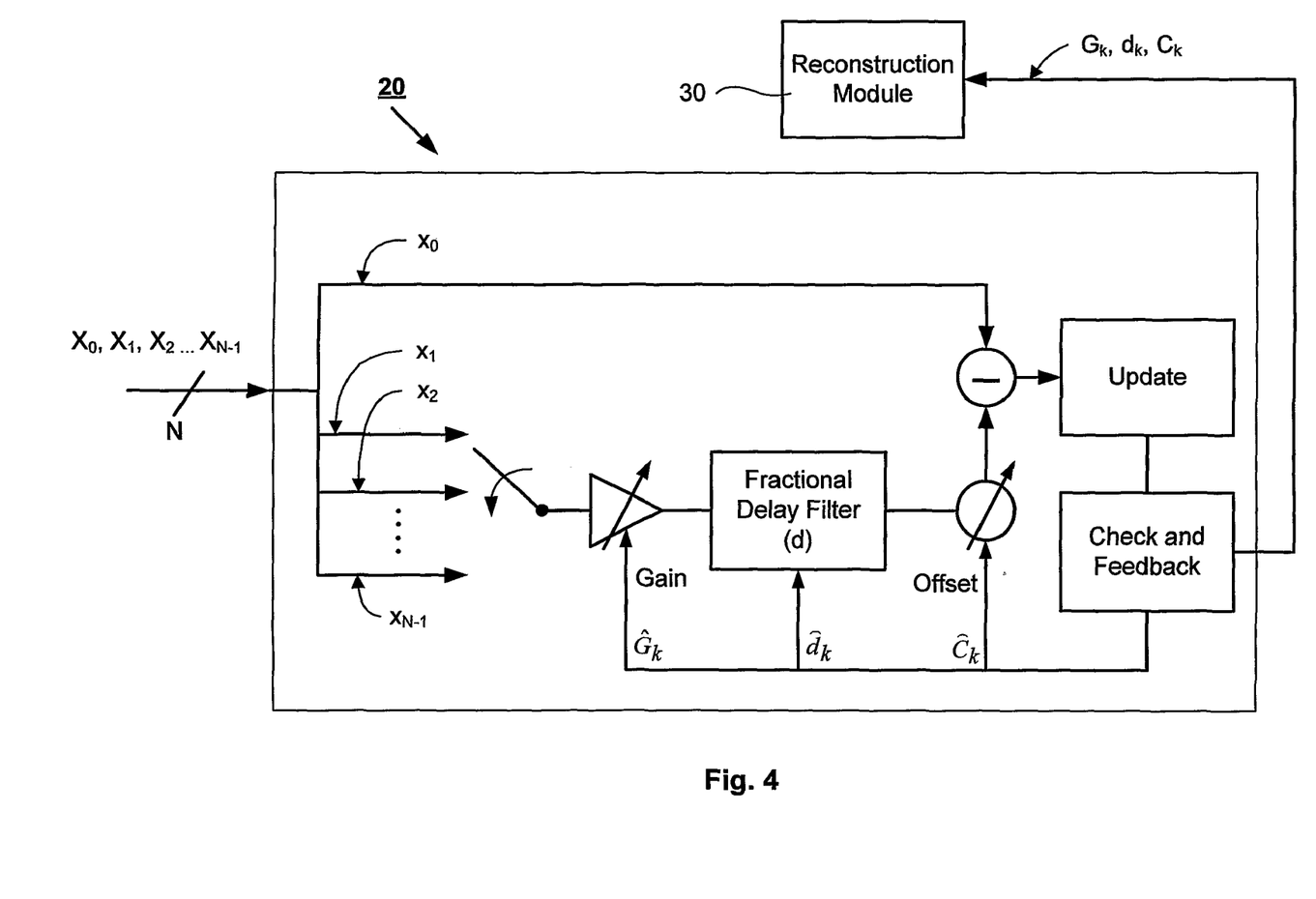
FIG. 4 shows details in the estimation module of the system in FIG. 3.

FIG. 4 shows the estimation module 20 in more detail. The function of the estimation module 20 will be further explained in connection with the flowchart in FIG. 5. Among the N digitized signals $X_0$ to $X_{N-1}$ entering the estimation module 20 it is preferred that signal $X_0$ is selected as a reference signal provided to a digital subtracter, whereas the remaining signals $X_1$-$X_{N-1}$ are provided to a multiplexer. The multiplexer is adapted to multiplex the signals $X_1$-$X_{N-1}$ to a variable amplifier. The amplifier is arranged to amplify or attenuate the signal provided by the multiplexer in a variable fashion depending on an input steering value, which e.g. can be done by means of digital multiplications. The resulting amplified or attenuated signal is provided to a delay filter. The delay filter is preferably a fractional delay filter (FD-filter) adapted to delay the received signal by fractions of the sampling period T for the analog-to-digital converter 10. It is particular preferred that the fractional delay filter is a Lagrange filter or a Farrow Structure filter or a Thiran Allpass filter.

The use of any of these filters for implementing a fractional delay filter is favored, as its filter response will have derivatives with respect to the delay that can be calculated analytically. This also further improves the numerical stability. The resulting delayed signal is provided to a variable offset adjuster. The offset adjuster is arranged to provide an offset to the received signal in a variable fashion depending on an input steering value, which e.g. can be done by means of digital additions and subtractions.

The resulting signal $y_k(n,d_k,G_k,C_k)$ from the offset adjuster is provided to the above mentioned subtracter, which is adapted to subtract the reference signal $X_0$ from the resulting signal $y_k(n,d_k,G_k,C_k)$. The difference $y_k(n,d_k,G_k,C_k)-X_0$ is squared in a digital squaring module so as to create a loss-function:

$$F(d_k, G_k, C_k) = \sum_{n=n_0}^{n_0+N-1} (y_k(n, d_k, G_k, C_k) - x_0(n))^2 \qquad \text{Eq. 1}$$

The loss-function $F(d_k,G_k,C_k)$ is in turn provided to a minimizer, which is adapted to estimate the channel-errors $\hat{d}_k, \hat{G}_k, \hat{C}_k$ between the reference signal $X_0$ and a signal $X_k$ of the remaining signals, $X_1$-$X_{N-1}$, as will be further explained below.

Here, it should be emphasized that the order in which the channel-errors are estimated can be more or less freely chosen so as to fit the application in question. Hence, the order in which the channel-errors are given in equations, expressions, text and figures herein should not be taken as determining the order in which they are actually estimated in an operative analog-to-digital converter, unless it is explicitly stated that the order is essential.

Figure 5:
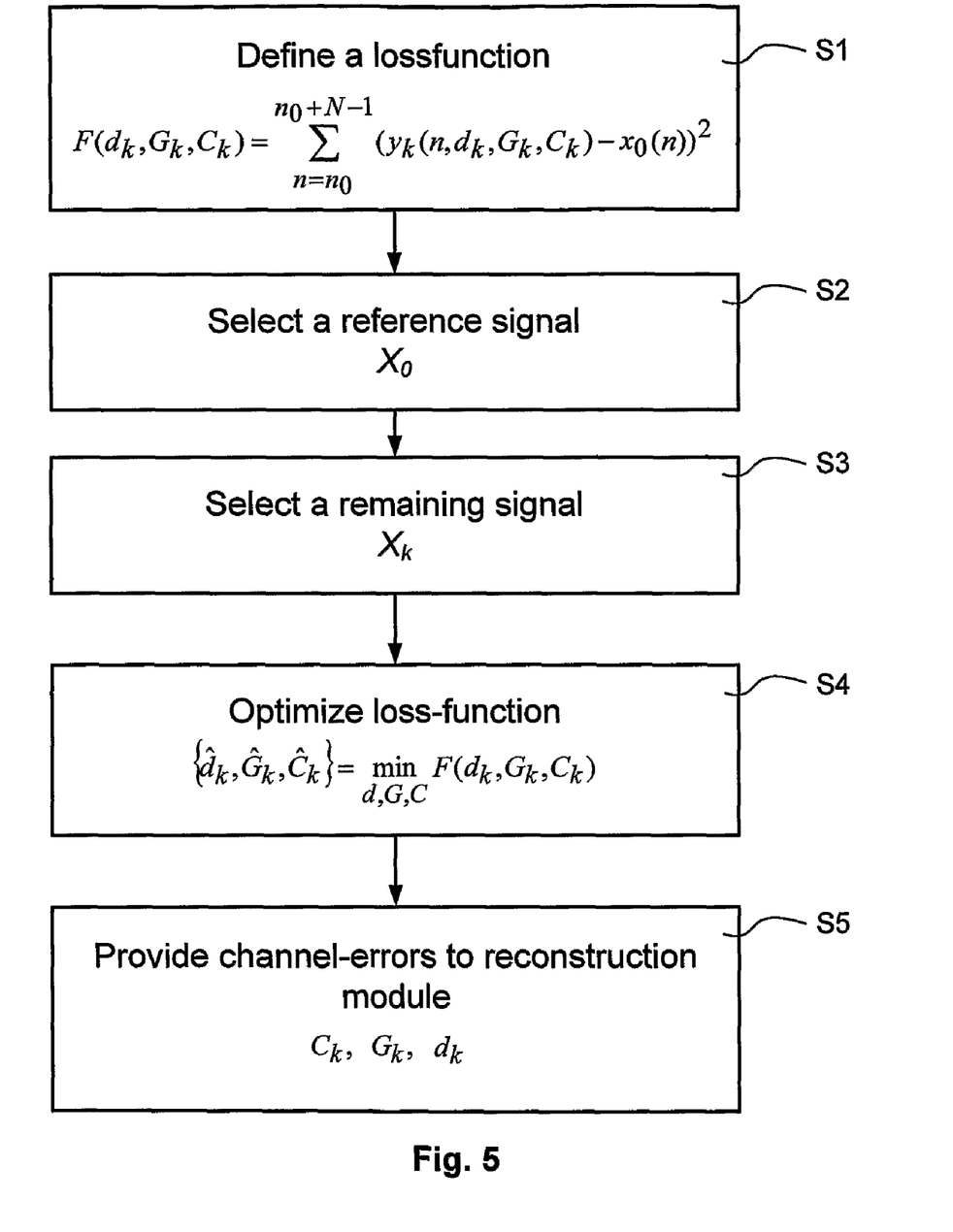
FIG. 5 shows a flowchart according to an embodiment of the present invention.

FIG. 5 shows a flowchart according to an embodiment of the present invention. The flowchart shows a detailed description of the digital signal processing steps performed by the error estimation module 20 in the estimation phase.

The calculations are preferably performed on batches of samples from the N digitized signals $X_0$-$X_{N-1}$ acquired from the N number of ADC:s in the analog-to-digital module 10. The length of each batch of samples, M, can be selected by the skilled person, but as an example, 1024 samples comprised by a signal $X_0$-$X_{N-1}$ is considered to be adequate. However, in some embodiments the calculations may be based on single samples of the N digitized signals $X_0$-$X_{N-1}$. As the method is performed in a sampled system, any time period will be expressed in terms of the sampling period of the system. Therefore, it is important to note that the sampling period of the entire system is equal to the interleaving delay T between adjacent ADC:s, whereas the sampling period of each ADC is NT.

It should be noted, that in the present example the parallelization is used to increase the data rate with maintained resolution, leading to the ADC sampling period NT. However, as the skilled person realizes, in the case where an increase in resolution is desired, the sampling period of each ADC can be shorter than NT, and in the extreme case the same as for the system sampling period, T. This will lead to an over sampled system and a decimation filter will be required on the output signal.

In step S1 of the illustrated example, a loss-function $F(d_k, G_k, C_k)$ is defined as previously described. The loss-function $F(d_k,G_k,C_k)$ represents a relationship—e.g. a difference—between a reference signal $X_0$ and a signal $X_k$ to be compared with the reference signal $X_0$. In addition, the loss-function $F(d_k,G_k,C_k)$ it is so defined that it can be easily minimized in order to determine at least one set of estimates $\hat{d}_k, \hat{G}_k, \hat{C}_k$ of the channel-errors $d_k, G_k, C_k$. The loss-function $F(d_k,G_k,C_k)$ may e.g. comprise a sum of squared values of the differences between the reference signal $X_0$ and the signal $X_k$ to be compared with the reference signal $X_0$ (see Eq. 1 above), or it may e.g. comprise a sum of absolute values of the differences between the reference signal $X_0$ and the signal $X_k$ to be compared with the reference signal $X_0$.

In step S2 of the illustrated example, one of the N digitized signals $X_0$-$X_{N-1}$ is selected as a reference signal $X_0$. Here, it is assumed that the channel-errors $d_0, G_0, C_0$ in the reference signal $X_0$ are zero and that the channel-errors $d_k, G_k, C_k$ in the other remaining signals $X_1$-$X_{N-1}$ are relative to the channel-errors $d_0, G_0, C_0$ in the reference signal $X_0$. As obvious to those skilled in the art, this will not introduce any limitation since the absolute channel-error is not important when eliminating or reducing the channel mismatch-errors in a time-interleaved analog-to-digital converter. It is likewise obvious to those skilled in the art that any of the signals $X_0$-$X_{N-1}$ can be selected as a reference signal.

In step S3 of the illustrated example, a signal $X_k$ is selected from the remaining signals $X_1$-$X_{N-1}$, which signal $X_k$ is to be compared with the reference signal $X_0$ selected in the previous step S1.

In step S4 of the illustrated example, the channel-errors $d_k$, $G_k$, $C_k$ are determined by optimizing the loss-function $F(d_k, G_k, C_k)$, so as to obtain estimates of the channel-errors $\hat{d}_k$, $\hat{G}_k$, $\hat{C}_k$, which in the illustrated example is done by minimizing the function, i.e.:

$$\{\hat{d}_k, \hat{G}_k, \hat{C}_k\} = \min_{d,G,C} F(d_k, G_k, C_k) \qquad \text{Eq. 2}$$

As can be seen from Eq. 2, this is a multivariable minimization. This optimization problem can be solved by conventional techniques, such as Steepest Descend (SD), Conjugated Gradient (CG) or similar. Since the exemplifying loss-function $F(d_k, G_k, C_k)$ in essence is a sum of positive factors—squares in the illustrated example—it ought to be rather smooth, in which case it might suffice with the aforementioned optimization procedures. However, other optimization procedures such as genetic algorithms might also be useful.

Figure 6:
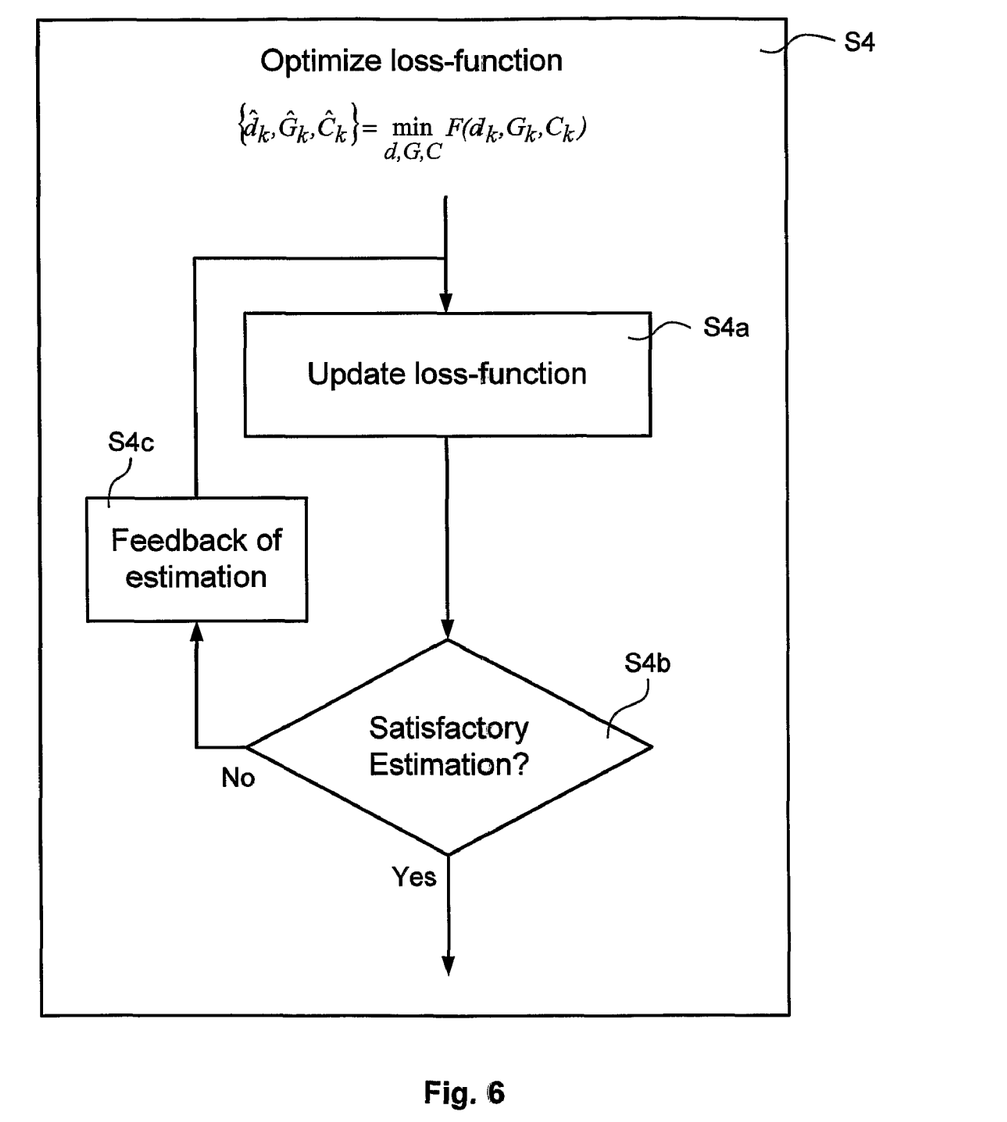
FIG. 6 shows an optimization of a loss-function $F(d_k, G_k, C_k)$ by means of an iterative process.

The optimization of the loss-function $F(d_k, G_k, C_k)$ in step S4 is preferably performed by means of an iterative process as schematically illustrated in FIG. 6.

Hence, in step S4a of the illustrated example, the loss-function $F(d_k, G_k, C_k)$ is provided with or updated with a batch of values from the reference signal $X_0$ that was selected in step S2 and a batch of values from the signal $X_k$ that was selected in step S3.

In step S4b of the illustrated example, it is preferred that the estimation is checked. If the estimation is unsatisfactory it is preferred that the method proceeds to step S4c.

In step S4c of the illustrated example, it is preferred that the estimates of the channel-errors $\hat{d}_k$, $\hat{G}_k$, $\hat{C}_k$ are feed back, i.e. feed back to the variable amplifier, the variable delay filter and the variable offset adjuster in the estimator 20 respectively. The variable amplifier, the variable delay filter and the variable offset adjuster are then adjusted according to the received estimated channel-errors $\hat{d}_k, \hat{G}_k, \hat{C}_k$ so as to reduce or eliminate the channel-errors in the signal $X_k$ compared to the reference signal $X_0$.

The variable amplifier, the variable delay filter and the variable offset adjuster being adjusted according to the received estimated channel-errors $\hat{d}_k, \hat{G}_k, \hat{C}_k$ are then applied to the signal $X_k$. A new set of estimated channel-errors $\hat{d}_k, \hat{G}_k, \hat{C}_k$ are then obtained in step S4a by providing or updating the loss-function $F(d_k, G_k, C_k)$ with the signal $X_k'$ being modified by the adjusted variable amplifier, variable delay filter and variable offset adjuster.

Each such iteration S4a, S4b, S4c can use a new batch of samples of the signal $X_k$ from the analog-to-digital module 10 or work with one single set of samples, depending on the amount of memory available.

In addition, it is preferred that the iterations continue until a satisfactory estimation has been achieved, which may e.g. be determined by the number of iterations performed and/or by comparing the previous set of estimated channel-errors with the new set. The optimization procedure may then be terminated when e.g. a certain number of iterations have been made and/or when the differences between a previous set and a new set of estimates are small enough.

When the estimation is found to be satisfactory in step S4b it is preferred that the method proceeds to step S5.

In step S5 of the illustrated example, a satisfactory estimation has been achieved and the channel-errors $d_k$, $G_k$, $C_k$ or a suitable representation thereof can be calculated from the final estimation $\hat{d}_k, \hat{G}_k, \hat{C}_k$ of the channel-errors. The channel-errors $d_k$, $G_k$, $C_k$ or suitable representations thereof are then provided to the reconstruction module 30.

Suitable reconstruction modules are well known per se by those skilled in the art. Typically such reconstruction modules comprises the necessary offset adjuster means, gain adjuster means and time adjuster means, which e.g. can be implemented by means of one ore more filter banks. An example describing the principles behind such reconstruction modules can be found in the paper "Reconstruction of Nonuniformly Sampled Bandlimited Signals by Means of Time-Varying Discrete-Time FIR Filters", published by Hindawi Publishing Corporation in EURASIP Journal on Applied Signal Processing, Volume 2006, Article ID 64185, pages 1-18.

The present invention has now been described with reference to exemplifying embodiments. However, the invention is not limited to the embodiments described above. On the contrary, the full extent of the invention is determined by the scope of the appended claims.

The invention claimed is:

1. A method for estimating a plurality of relative channel-errors for at least one signal with respect to a reference signal belonging to a group of digitized signals received by an estimation module; wherein said method is performed by said estimation module, the method comprising:
    defining a loss function representing a difference between said reference signal and a remaining signal in said group of digitized signals, wherein said group of digitized signals are produced by an analog-to-digital module comprising a plurality of parallel and time interleaved analog-to-digital converters, each converter producing a respective one of said group of digitized signals;
    selecting the reference signal in said group of digitized signals;
    selecting the remaining signal from the remaining signals in said group of digitized signals; and
    minimizing the loss function to thereby obtain an estimate or a representation of an estimate of said plurality of relative channel-errors for the selected remaining signal.

2. The method according to claim 1, wherein the optimizing is performed by an iterative process comprising:
    feedback of the channel-error or channel-errors estimated in the previous iteration so as to adjust the channel-error in the sequence of the second signal;
    updating the function with a sequence of the second signal having channel-errors adjusted by said feedback; and
    repeating said feedback and said update until a satisfactory estimation is obtained.

3. The method according to claim 1, wherein said plurality of estimated channel-errors is calculated by defining said function as a measure of the difference between said sequences with respect to said plurality of channel-errors, and by performing an optimization by minimizing the defined function.

4. The method according to claim 2, wherein at least one of the estimated channel-errors is an estimated delay corresponding to a delay mismatch, which estimated delay is applied to the selected signal using a fractional delay filter.

5. The method according to claim 4, wherein said fractional delay filter is implemented using a Lagrange, Farrow Structure or Thiran Allpass.

6. The method according to claim 1, wherein the loss function is defined as $$F(d_k, G_k, C_k) = \sum_{n=n_0}^{n_0+N-1} (y_k(n, d_k, G_k, C_k) - x_0(n))^2,$$

where
($d_k$, $G_k$, $C_k$) represent the plurality of relative channel-errors.

7. The method according to claim 1, further comprising:
repeating said further steps for each one of the other remaining signals.

8. The method according to claim 1, wherein the loss-function comprises a sum of squared values of differences between the reference signal and the selected remaining signal, or comprises a sum of absolute values of differences between the reference signal and the selected remaining signal.

9. The method according to claim 1, wherein the estimates of the channel-errors are obtained by minimizing the loss function $$\left(\{\hat{d}_k, \hat{G}_k, \hat{C}_k\} = \min_{d,G,C} F(d_k, G_k, C_k)\right),$$

($d_k$, $G_k$, $C_k$) represent the plurality of relative channel-errors,
($\hat{d}_k$, $\hat{G}_k$, $\hat{C}_k$) represent the estimated channel-errors, and
F represents the loss function.

10. The method according to claim 1, wherein said relative channel-errors for the selected remaining signal belong to the group of aperture delay mismatch error, gain mismatch error and offset mismatch error.

11. An estimation module for estimating a plurality of relative channel-errors or a representation thereof for at least one signal with respect to a reference signal belonging to a group of digitized signals, where said estimation module is configured to operatively receive said digitized signals and to operatively select the reference signal in said group of signals, and wherein the estimation module is further configured to operatively:
select a remaining signal from the remaining signals in said group of digitized signals, wherein said group of digitized signals are produced by an analog-to-digital module comprising a plurality of parallel and time interleaved analog-to-digital converters, each converter producing a respective one of said group of digitized signals; and
minimize a loss function, representing a difference between said reference signal and the selected remaining signal to thereby obtain an estimate or a representation of an estimate of said plurality of relative channel-errors for the selected remaining signal.

12. The estimation module according to claim 11, wherein the module performs said optimizing by being further configured to operatively:

feedback the channel-error or channel-errors estimated in the previous iteration so as to adjust the channel-error in the sequence of the second signal;
update the function with a sequence of the second signal having channel-errors adjusted by said feedback; and
repeat said feedback and said update until a satisfactory estimation is obtained.

13. The estimation module according to claim 11, wherein the estimation module is further configured
to operatively calculate said plurality of estimated channel-errors by utilizing a function defining a measure of the difference between said sequences with respect to said plurality of channel-errors, and by performing an optimization by minimizing the defined function.

14. The estimation module according to claim 13, wherein the estimation module is further configured
to operatively estimate a plurality of channel-errors, wherein least one of the estimated channel-errors is an estimated delay corresponding to a delay mismatch, and to apply the estimated delay to the selected signal using a fractional delay filter.

15. The estimation module according to claim 14, wherein said fractional delay filter is implemented by using a Lagrange, Farrow Structure or Thiran Allpass.

16. The estimation module according to claim 11, wherein the estimation module is further configured
to operatively use the function:

$$F(d_k, G_k, C_k) = \sum_{n=n_0}^{n_0+N-1} (y_k(n, d_k, G_k, C_k) - x_0(n))^2,$$

where
($d_k$, $G_k$, $C_k$) represent the plurality of relative channel-errors.

17. The estimation module according to claim 11, further comprising:
repeating said selection and optimizing for each remaining signal in said group of signals.

18. The estimation module according to claim 11, wherein the loss-function comprises a sum of squared values of differences between the reference signal and the selected remaining signal, or comprises a sum of absolute values of differences between the reference signal and the selected remaining signal.

19. The estimation module according to claim 11, wherein the estimation module is configured to obtain the estimates of the channel-errors are by minimizing the loss function $$\left(\{\hat{d}_k, \hat{G}_k, \hat{C}_k\} = \min_{d,G,C} F(d_k, G_k, C_k)\right),$$

($d_k$, $G_k$, $C_k$) represent the plurality of relative channel-errors,
($\hat{d}_k$, $\hat{G}_k$, $\hat{C}_k$) represent the estimated channel-errors, and
F represents the loss function.

20. The estimation module according to claim 11, wherein said relative channel-errors for the selected remaining signal belong to the group of aperture delay mismatch error, gain mismatch error and offset mismatch error.

21. A system for reducing or eliminating a plurality of relative channel-errors for at least one signal with respect to a reference signal belonging to a group of digitized, the system comprising:

an estimation module configured to operatively receive said group of digitized signals and to provide an estimate of the plurality of relative channel-errors or a representation of the estimate, wherein said group of digitized signals are produced by an analog-to-digital module comprising a plurality of parallel and time interleaved analog-to-digital converters, each converter producing a respective one of said group of digitized signals, and a reconstruction module configured to operatively apply said estimate of said plurality of relative channel-errors or the representation of the estimate to said at least one signal to reduce or eliminate the plurality of relative channel-error for the at least one signal.

* * * * *